United States Patent
Kim et al.

(10) Patent No.: US 8,457,246 B2
(45) Date of Patent: Jun. 4, 2013

(54) APPARATUS AND METHOD FOR ENVELOPE TRACKING POWER AMPLIFIER IN WIRELESS COMMUNICATION SYSTEM

(75) Inventors: Shin-Ho Kim, Gyeonggi-do (KR); Hyung-Weon Park, Seoul (KR)

(73) Assignee: Samsung Electronics Co., Ltd (KR)

(*) Notice: Subject to any disclaimer, the term of this patent is extended or adjusted under 35 U.S.C. 154(b) by 343 days.

(21) Appl. No.: 12/876,555

(22) Filed: Sep. 7, 2010

(65) Prior Publication Data

US 2011/0058601 A1 Mar. 10, 2011

(30) Foreign Application Priority Data

Sep. 7, 2009 (KR) .................. 10-2009-0083798

(51) Int. Cl.
*H04L 27/00* (2006.01)

(52) U.S. Cl.
USPC ........... 375/295; 375/296; 375/297; 375/238; 327/306; 327/309; 327/308; 327/310; 327/314; 332/106; 332/107; 332/109; 332/110; 332/112

(58) Field of Classification Search
USPC .................. 375/295, 296, 297, 238; 327/306, 327/309, 308, 310, 314; 332/106, 107, 109, 332/110, 112
See application file for complete search history.

(56) References Cited

U.S. PATENT DOCUMENTS

| | | | |
|---|---|---|---|
| 6,681,101 B1 * | 1/2004 | Eidson et al. | 455/127.1 |
| 7,702,300 B1 * | 4/2010 | McCune | 455/108 |
| 7,843,262 B2 * | 11/2010 | Takenaka | 330/136 |
| 8,145,147 B2 * | 3/2012 | Sander et al. | 455/108 |
| 2003/0198300 A1 * | 10/2003 | Matero et al. | 375/297 |
| 2005/0017800 A1 | 1/2005 | Robinson | |
| 2007/0258602 A1 * | 11/2007 | Vepsalainen et al. | 381/104 |
| 2008/0265996 A1 | 10/2008 | Kim et al. | |
| 2009/0191826 A1 * | 7/2009 | Takinami et al. | 455/110 |
| 2009/0252255 A1 * | 10/2009 | Lee et al. | 375/297 |

* cited by examiner

*Primary Examiner* — Siu Lee
(74) *Attorney, Agent, or Firm* — The Farrell Law Firm, P.C.

(57) ABSTRACT

An apparatus and method for amplifying a Transmit (Tx) signal according to an Envelope Tacking (ET) scheme in a wireless communication system are provided. A transmitting end apparatus includes an envelope gain controller for controlling a gain of a digital baseband Tx signal in accordance with power control, a detector for detecting an envelope signal from the digital baseband Tx signal whose gain is controlled, and for shaping on the envelope signal, a first Digital to Analog Converter (DAC) for converting the shaped envelope signal into an analog signal, and an envelope modulator for generating a drain bias of a power amplifier that amplifies a Radio Frequency (RF) Tx signal by using the analog envelope signal. Accordingly, a digital-based ET scheme is implemented, and by using a plurality of shaping tables, efficiency of the ET scheme can be maximized in a transmitting end that uses power control.

16 Claims, 5 Drawing Sheets

——— : OUTPUT ENVELOPE SIGNAL
·········· : ORIGINAL ENVELOPE SIGNAL

APPARATUS AND METHOD FOR ENVELOPE TRACKING POWER AMPLIFIER IN WIRELESS COMMUNICATION SYSTEM

PRIORITY

The present application claims priority under 35 U.S.C. §119(a) to a Korean patent application filed in the Korean Intellectual Property Office on Sep. 7, 2009 and assigned Serial No. 10-2009-0083798, the entire content of which is incorporated herein by reference.

BACKGROUND OF THE INVENTION

1. Field of the Invention

The present invention generally relates to a wireless communication system, and in particular, to an apparatus and method for supporting an Envelope Tracking (ET) power amplifier in a transmitting end that uses power control in a wireless communication system.

2. Description of the Related Art

As a standard of a next-generation wireless communication system (e.g., Institute of Electrical and Electronics Engineers (IEEE) 802.16m, 3rd Generation Partnership Project 2 (3GPP2) Long Term Evolution (LTE), etc.) is defined based on an Orthogonal Frequency Division Multiplexing (OFDM), an efficiency deterioration problem caused by a high Peak to Average Power Ratio (PAPR) which is a characteristic of the OFDM is becoming a big issue. To overcome this problem, various schemes such as Doherty, Envelop Tracking (ET), Envelope Elimination and Restoration (EER), etc., are being researched and developed.

The Doherty scheme is a technique in which peaking amplifiers are connected in parallel and efficiency is increased by using load modulation. Although the Doherty scheme can be implemented relatively simply, an amount of improvable efficiency is limited. In comparison thereto, the EER scheme is a technique in which a bias of a power amplifier is dynamically controlled along an envelope of an input signal, and can achieve the highest efficiency improvement. However, to implement the EER amplifier, in the case of an LTE system that uses a signal having a frequency 10 to 20 times higher than that of an envelope input signal, i.e., a signal having a frequency of 20 MHz, an Envelope Modulator (EM) for modulating a drain (or collector) bias of the power amplifier with significantly high efficiency is required when a signal having a frequency higher than 200 to 400 MHz is used. However, there is a difficulty in that its implementation is almost impossible in practice or implementation costs are significantly high.

The ET scheme is a technique which can be implemented with sufficiently high efficiency in practice as a compromise between the Doherty scheme and the EER scheme. The ET scheme uses a power amplifier having linearity without having to completely eliminate the envelope as in the EER scheme, and thus a signal having about a 3-fold frequency, not a 10-fold frequency, can be used as an input signal of the EM.

The ET scheme has generally been used by a Base Station (BS) due to its relatively complex structure. However, as Complementary Metal-Oxide Semiconductor (CMOS) technologies have been recently developed and a cheap and easy digital circuit implementation has become possible, an attempt for applying the ET scheme to a user terminal, a Consumer Premise (CP), etc., has been taken into account.

A biggest difference between the BS and the terminal lies in whether power control is applied or not. In the case of the BS, transmit power is constant, whereas in the case of the terminal, power control is persistently performed according to a channel environment. In the currently used ET scheme, an operation of the power control environment is limited, and if relatively small power is used in comparison with the BS, such as in the case of using the terminal or the like, power consumption of the EM and power consumption of an extra device added for an operation of the ET scheme may become greater than a power amount saved in the power amplifier. Accordingly, in order to apply the ET scheme to a transmitting end (e.g., the terminal or the like) that performs power control by using low power, there is a need to overcome the aforementioned problems.

SUMMARY OF THE INVENTION

The present invention has been made to substantially address at least the above-described problems and/or disadvantages and to provide at least the advantages below. Accordingly, one aspect of the present invention is to provide an apparatus and method for supporting an Envelope Tracking (ET) power amplifier in a transmitting end that uses power control in a wireless communication system.

Another aspect of the present invention is to provide an apparatus and method for applying a digital-based ET scheme in a wireless communication system.

Another aspect of the present invention is to provide an apparatus and method for performing envelope shaping according to a signal characteristic in a wireless communication system.

In accordance with an aspect of the present invention, a transmitting end apparatus for amplifying a Transmit (Tx) signal according to an ET scheme in a wireless communication system is provided. The apparatus includes an envelope gain controller for controlling a gain of a digital baseband Tx signal in accordance with power control, a detector for detecting an envelope signal from the digital baseband Tx signal whose gain is controlled, and for shaping on the envelope signal, a first Digital to Analog Converter (DAC) for converting the shaped envelope signal into an analog signal, and an envelope modulator for generating a drain bias of a power amplifier that amplifies a Radio Frequency (RF) Tx signal by using the analog envelope signal.

In accordance with another aspect of the present invention, a method of operating a transmitting end for amplifying a Tx signal according to an ET scheme in a wireless communication system is provided. The method includes controlling a gain of a digital baseband Tx signal in accordance with power control, detecting an envelope signal from the digital baseband Tx signal whose gain is controlled, and shaping on the envelope signal, converting the shaped envelope signal into an analog signal, and generating a drain bias of a power amplifier that amplifies an RF Tx signal by using the analog envelope signal.

BRIEF DESCRIPTION OF THE DRAWINGS

For a more complete understanding of the present invention and its advantages, reference is now made to the following description taken in conjunction with the accompanying drawings, in which like reference numerals represent like parts, wherein.

DETAILED DESCRIPTION OF EMBODIMENTS OF THE PRESENT INVENTION

The present invention described below relates to a technique for applying an Envelope Tracking (ET) power amplifier in a transmitting end that uses power control.

Figure 1:
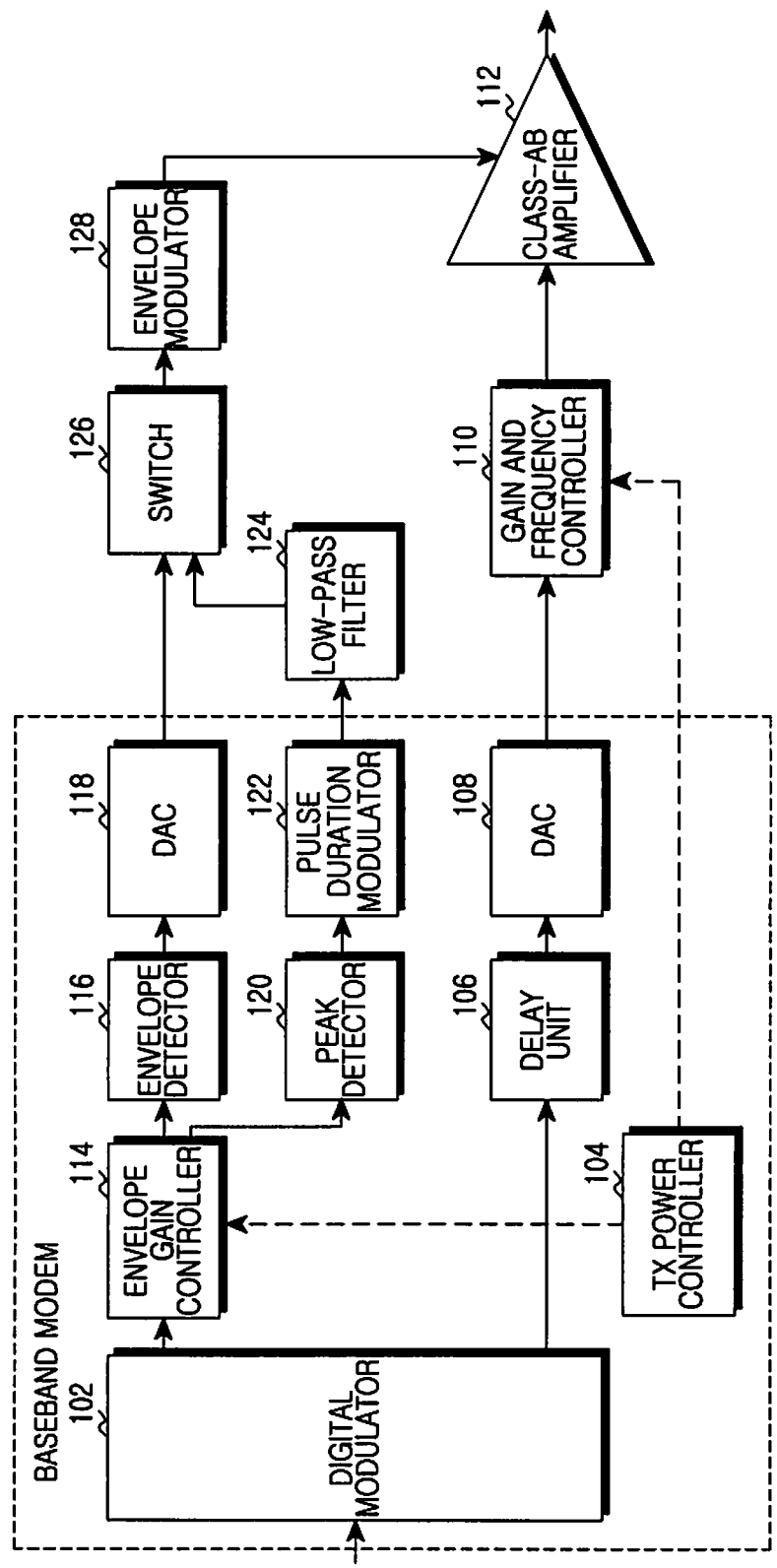
FIG. 1 is a block diagram illustrating a structure of a transmitting end in a wireless communication system according to an embodiment of the present invention.

FIG. 1 is a block diagram illustrating a structure of a transmitting end in a wireless communication system according to an embodiment of the present invention.

Referring to FIG. 1, the transmitting end includes a digital modulator 102, a transmit (Tx) power controller 104, a delay unit 106, a Digital to Analog Converter (DAC) 108, a gain and frequency controller 110, a class AB amplifier 112, an envelope gain controller 114, an envelope detector 116, a DAC 118, a peak detector 120, a pulse duration modulator 122, a low-pass filter 124, a switch 126, and an envelope modulator 128.

The digital modulator 102 converts a Tx bit-stream into a digital Tx signal. For example, in the case of using an Orthogonal Frequency Division Multiplexing (OFDM) scheme, the digital modulator 102 codes and modulates the Tx bit-stream to generate complex symbols, maps the complex symbols to subcarriers, and then generates OFDM symbols by performing an Inverse Fast Fourier Transform (IFFT) operation and Cyclic Prefix (CP) insertion.

The Tx power controller 104 controls the envelope gain controller 114 and the gain and frequency controller 110 according to a result of power control. That is, the Tx power controller 104 determines Tx power of the transmitting end according to a system specification and under the control of a Base Station (BS), and controls an operation of the envelope gain controller 114 and the gain and frequency controller 110 so as to control a signal gain according to the determined Tx power.

The delay unit 106 delays delivery of a Tx signal during a time for processing an envelope. The DAC 108 converts a digital signal provided from the delay unit 106 into an analog signal. The gain and frequency controller 110 controls a gain of an analog Tx signal under the control of the transmit power controller 104, and simultaneously up-converts a baseband signal into a Radio Frequency (RF) signal. The gain and frequency controller 110 includes at least one amplifier to control the gain of the Tx signal, and includes at least one mixer for the up-conversion. The class AB amplifier 112 amplifies power of a signal provided from the gain and frequency controller 110, and operates by using voltage provided from the envelope modulator 128 as a drain bias.

The envelope gain controller 114 controls a gain of the digital Tx signal under the control of the transmit power controller 104. The envelope detector 116 detects an envelope from a signal provided from the envelope gain controller 114. In this case, the envelope detector 116 detects an envelope for a duration having a size greater than or equal to a reference value. As to a duration having a size less than the reference value, the envelope detector 116 outputs the reference value as an envelope signal. Further, the envelope detector 116 shapes on the envelope signal in order to limit a bandwidth of the detected envelope signal. Herein, the shaping implies an operation of changing a duration which rapidly changes from a minimum value in the envelope signal into a duration which increases gradually. The DAC 118 converts a digital signal provided from the envelope detector 116 into an analog signal. The peak detector 120 detects peak values of the envelope signal. The pulse duration modulator 122 generates pulse signals by using the peak values. In other words, the pulse duration modulator 122 generates a pulse signal having a duration corresponding to the peak value detected by the peak detector 120. The low-pass filter 124 performs low-pass filtering on the pulse signals generated by the pulse duration modulator 122.

The switch 126 provides the envelope modulator 128 with one of a signal from the DAC 118 and a signal from the low-pass filter 124 according to a magnitude of output power of the transmitting end. That is, if the magnitude of the output power is greater than or equal to a threshold, the switch 126 outputs the signal from the DAC 118, and if the magnitude of the output power is less than the threshold, the switch 126 outputs the signal from the low-pass filter 124.

The envelope modulator 128 generates a drain bias of the class AB amplifier 112 by using a signal input through the switch 126. That is, since the signal provided using the switch 126 is an envelope signal extracted from a Tx signal, the envelope modulator 128 amplifies the envelope signal to a magnitude enough to be used as a drain bias of the class AB amplifier 112. For example, the envelope modulator 128 includes a linear amplifier and a Direct Current (DC)/DC amplifier.

A characteristic of the transmitting end according to an embodiment of the present invention will be described with reference to FIG. 1.

Referring to FIG. 1, the delay unit 106 and the envelope detector 116 operate for digital signals. Accordingly, envelope shaping and delay control can be more flexibly performed than when they are performed for analog signals. For example, the envelope shaping is performed while being optimized to a characteristic of a Tx signal. More specifically, the envelope shaping is performed by using a Look-Up Table (LUT) that represents a relation of an input value and an output value. The envelope detector 116 stores a plurality of LUTs corresponding to characteristics of various Tx signals, and performs the envelope shaping by using an LUT optimized to a current system. Herein, a factor having an effect on the determination of the LUT includes a Peak to Average Power Ratio (PAPR) property, a modulation scheme, etc.

Further, in the transmitting end according to the embodiment of the present invention, in order to apply a result of power control before envelope detection, the envelope gain controller 114 is located prior to the envelope detector 116. That is, the power control is applied also to the envelope gain control at the same time as obtaining a gain control signal of the transmitting end according to a Transmit Power Control (TPC) command. Herein, the TPC command is a message for controlling output power of the transmitting end.

Figure 2:
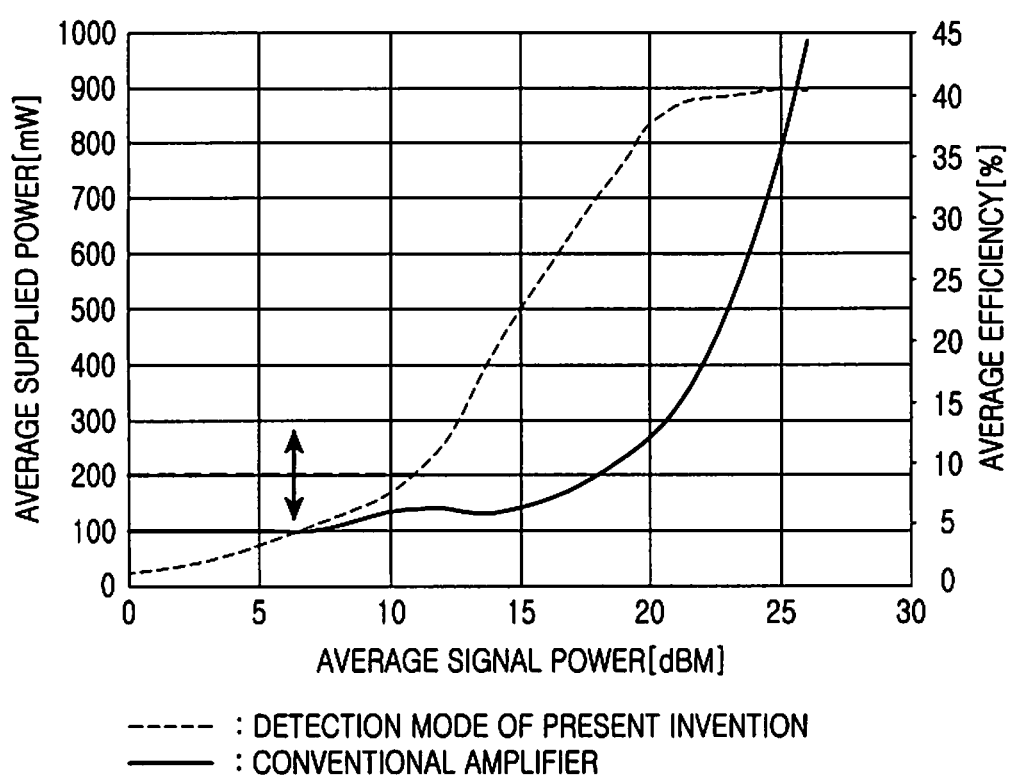
FIG. 2 is a graph illustrating efficiency in a gain control mode of a transmitting end in a wireless communication system according to an embodiment of the present invention.

FIG. 2 is a graph illustrating efficiency in a gain control mode of a transmitting end in a wireless communication system according to an embodiment of the present invention. When a terminal uses a power amplifier with a level of 1 W or less, efficiency in a high power region increases. Referring to FIG. 2, in the range of 15 dB to 23 dB, power consumption decreases by about 300 mW or more by applying an ET scheme. However, as illustrated in FIG. 2, in the range of about 10 dBm to 12 dBm or less, a decrease amount of power consumption is rapidly reduced. Further, when considering power consumption additionally used for the ET scheme, e.g., power consumption caused by a DAC and power consumption for digital processes, a gain for power consumption is more rapidly reduced.

In order to solve the problem of efficiency deterioration in the low power region described above, the transmitting end according to the embodiment of the present invention has two modes depending on output power of a Tx signal. The two modes are a gain control mode and a bypass mode. The gain control mode is a mode in which the output of the envelope gain controller 114 is provided to the envelope modulator 128 via the envelope detector 116 and the DAC 118. The bypass mode is a mode in which the output of the envelope gain controller 114 is provided to the envelope modulator 128 via the peak detector 120, the pulse duration modulator 122, and the low-pass filter 124. For example, whether the bypass mode is activated can be determined by a TPC command.

If output power of the transmitting end is less than a reference threshold, the bypass mode is activated to stop operations of the envelope detector 116 and the DAC 118, thereby minimizing power consumption. On the other hand, operations of the peak detector 120, the pulse duration modulator 122, and the low-pass filter 124 are activated. Accordingly, a pulse signal having a duration corresponding to a peak value detected by the peak detector 120 is generated by the pulse duration modulator 122, and a DC signal having a magnitude corresponding to a duration of the pulse signal is generated by the low-pass filter 124. Further, the switch 126 switches the DC signal from the low-pass filter 124 to output the DC signal to the envelope modulator 128. In this case, the envelope modulator 128 amplifies the DC signal, and thus the envelope modulator 128 inactivates an operation of an internal linear amplifier, and contributes to efficiency increase by using only the internal high-efficiency DC/DC amplifier.

Figure 3A:
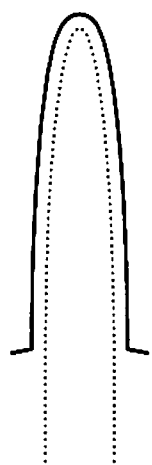
FIGS. 3A to 3C illustrate output of envelope signals for each mode of a transmitting end in a wireless communication system according to an embodiment of the present invention.
Figure 3B:
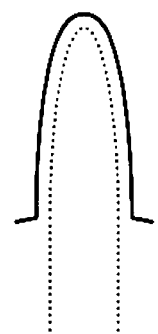
Figure 3C:
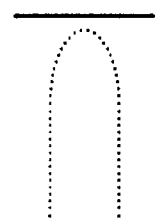

FIG. 3 illustrates an output of an envelope signal for each mode of a transmitting end, i.e., an input of the envelope modulator 128, in a wireless communication system according to an embodiment of the present invention. FIG. 3A illustrates a case where an output power level is constant to a maximum value similar to a signal of a BS. FIG. 3B illustrates a case where envelope gain control is performed when output power is controlled to be low. FIG. 3C illustrates a case where output power is further lower than a threshold. Even if the output power is further lower than the threshold, an efficiency gain decreases when performing gain control as described above, and thus a signal having a reference magnitude corresponding to a peak value as illustrated in FIG. 3C is output as an envelope signal. However, according to another embodiment of the present invention, instead of the signal having the same magnitude as the peak value, a signal having a pre-defined reference magnitude can be output. Alternatively, according to still another embodiment of the present invention, a pre-determined number of candidate signals having a reference magnitude can be defined, and a signal having a reference magnitude closest to the peak value can be output.

Figure 4:
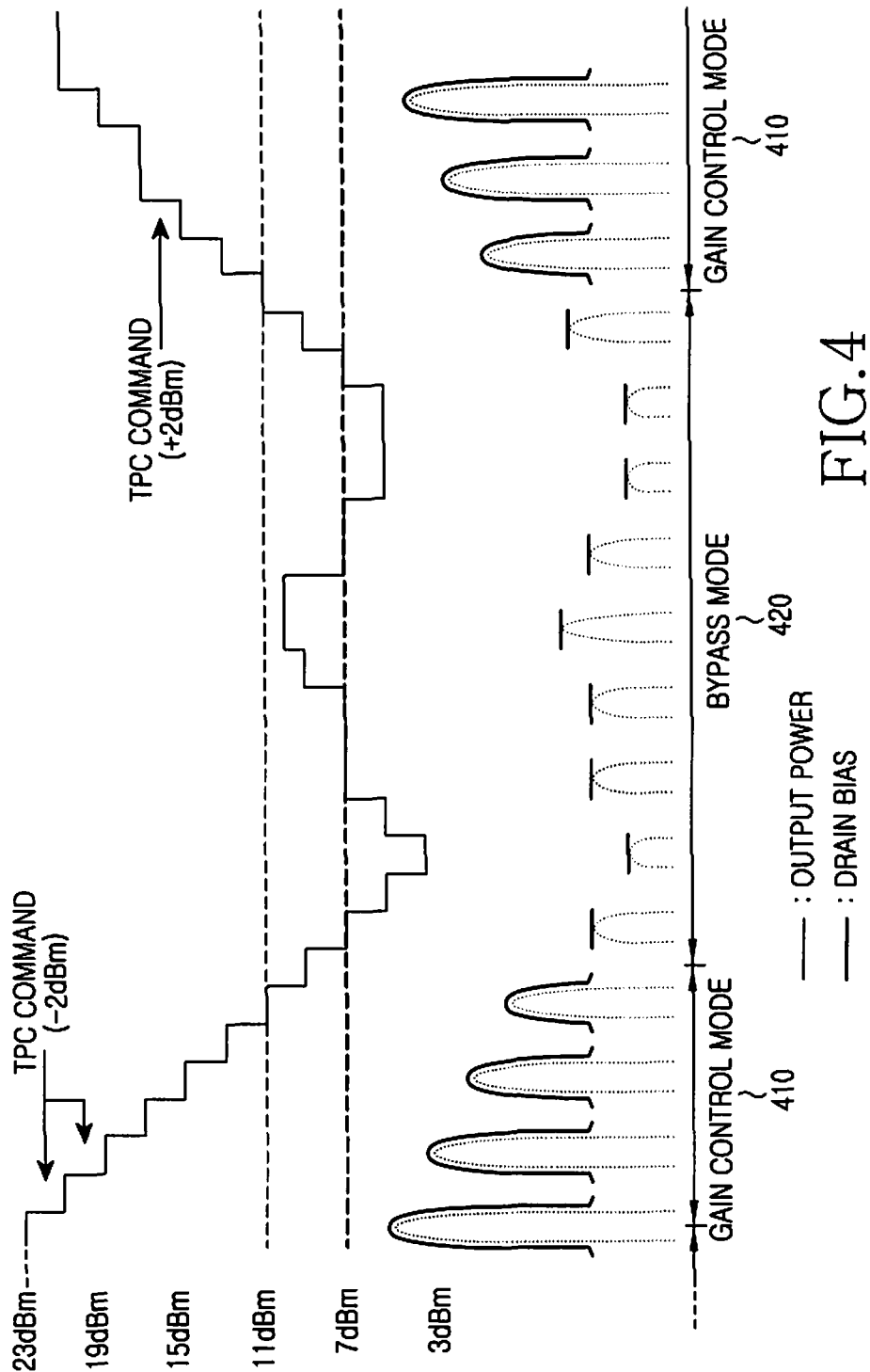
FIG. 4 illustrates changes in a drain bias depending on changes in output power in a wireless communication system according to an embodiment of the present invention.

An example of a drain bias that changes along with the change of output power is illustrated in FIG. 4. In FIG. 4, a threshold value for activation of a bypass mode 420 is 11 dBm. Therefore, in a duration in which output power calculated by a TPC command is less than or equal to 11 dBm, a transmitting end operates in the bypass mode 420. Accordingly, the transmitting end which detects an envelope in a gain control mode 410 transitions to the bypass mode 420, detects a peak value of a signal, and uses a DC signal corresponding to the peak value as a drain bias.

Figure 5:
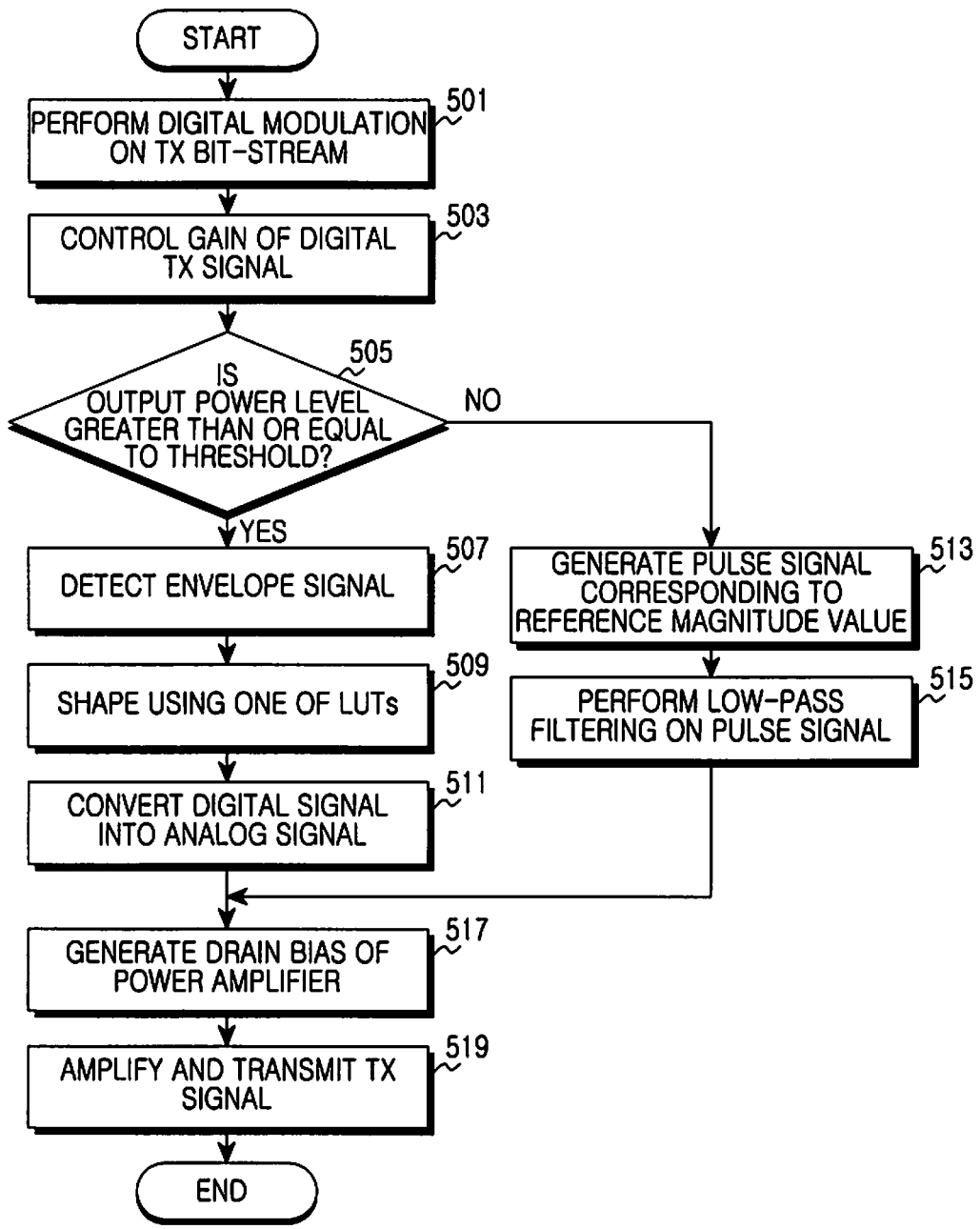
FIG. 5 is a flowchart which illustrates a process of operating a transmitting end in a wireless communication system according to an embodiment of the present invention.

FIG. 5 is a flowchart illustrating a process of operating a transmitting end in a wireless communication system according to an embodiment of the present invention.

Referring to FIG. 5, the transmitting end converts a Tx bit-stream into a digital Tx signal in step 501. For example, when using an OFDM scheme, the transmitting end generates complex symbols by performing coding and modulation on the Tx bit-stream, maps the complex symbols to subcarriers, and then generates OFDM symbols by performing an IFFT operation and CP insertion.

In step 503, the transmitting end controls a gain of the digital Tx signal according to output power of the transmitting end. That is, the transmitting end increases a magnitude of the digital Tx signal according to the output power. For example, the output power of the transmitting end is determined by a TPC command.

In step 505, the transmitting end determines whether an output power level is greater than or equal to a threshold. Herein, the threshold is defined to select one of the bypass mode and the gain control mode. Preferably, power consumption caused by envelope signal detection and shaping is determined to a signal power value that exceeds a gain obtained by using an ET scheme.

If the output power level is greater than or equal to the threshold, the transmitting end determines that a current mode is a gain control mode, and proceeding to step 507, the transmitting ends detects an envelope signal of the digital Tx signal generated in step 501. In this case, the transmitting end detects an envelope for a duration having a size greater than or equal to a reference value, and outputs the reference value as the envelope signal with respect to a duration having a size less than the reference value. That is, the envelope signal has a clipping pattern in the reference value.

After detecting the envelope, proceeding to step 509, the transmitting end shapes on the envelope signal in order to limit a bandwidth of the envelope signal detected by using one of a plurality of LUTs. Herein, the shaping implies an operation of changing a duration which rapidly changes from a minimum value in the envelope signal into a duration which increases gradually. That is, the transmitting end stores a plurality of LUTs corresponding to characteristics of various Tx signals, and performs envelope shaping by using an LUT optimized to a current system. Herein, a factor having an effect on the determination of the LUT includes a PAPR property, a modulation scheme, etc. In step 511, the transmitting end converts a digital envelope signal into an analog signal.

If the output power level is less than the threshold in step 505, the transmitting end determines that the current mode is the bypass mode, and proceeding to step 513, generates a pulse signal having a duration corresponding to a reference magnitude value. Herein, the reference magnitude value is one of a value closest to a peak value of the digital baseband Tx signal among a peak value of the digital baseband Tx signal, a pre-defined reference value, and a plurality of pre-defined values.

In step 515, the transmitting end performs low-pass filtering on the pulse signals. Accordingly, a DC signal having a magnitude corresponding to the duration of the pulse signal is generated.

In step 517, the transmitting end generates a drain bias of a power amplifier by using one of an analog envelope signal generated in step 511 and a DC signal generated in step 515. That is, the transmitting end amplifies the analog envelope signal or the DC signal to a signal having a magnitude sufficient enough to be usable for the drain bias by performing at least one of linear amplification and DC/DC amplification. In this case, when operating in the bypass mode, the transmitting end performs only DC/DC amplification.

In step 519, the transmitting end amplifies an RF Tx signal according to the drain bias, and thereafter transmits the amplified signal through an antenna.

According to embodiments of the present invention, a digital-based Envelope Tacking (ET) scheme is implemented, and by using a plurality of shaping tables, efficiency of the ET scheme can be maximized in a transmitting end that uses power control.

While embodiments of the present invention have been described above, it should be clear that many variations and/or modifications of the basic inventive concept which may appear to those skilled in the art will still fall within the spirit and scope of the present invention, as defined by the appended claims.

What is claimed is:

1. A transmitting end apparatus for amplifying a Transmit (Tx) signal according to an Envelope Tracking (ET) scheme in a wireless communication system, the apparatus comprising:
   an envelope gain controller for controlling a gain of a digital baseband Tx signal in accordance with power control;
   a detector for detecting an envelope signal from the digital baseband Tx signal whose gain is controlled, and for shaping the envelope signal;
   a first Digital to Analog Converter (DAC) for converting the shaped envelope signal into an analog envelope signal; and
   an envelope modulator for generating a drain bias of a power amplifier that amplifies a Radio Frequency (RF) Tx signal by using the analog envelope signal,
   wherein, if output power of the transmitting end apparatus is less than a threshold, the envelope modulator generates the drain bias of the power amplifier using a Direct Current (DC) signal, with a magnitude of the DC signal being determined based on the output power.

2. The apparatus of claim 1, wherein the detector shapes by using a Look-Up Table (LUT) corresponding to a characteristic of the Tx signal among a plurality of LUTs.

3. The apparatus of claim 1, further comprising:
   a peak detector for outputting a reference magnitude value when the output power of the transmitting end is less than the threshold;
   a Pulse Duration Modulator (PDM) for generating a pulse signal having a duration corresponding to the reference magnitude value and for providing the pulse signal to the envelope modulator; and
   a low-pass filter for generating the DC signal having the magnitude corresponding to the duration of the pulse signal.

4. The apparatus of claim 3, wherein the reference magnitude value is a value closest to a peak value of the digital baseband Tx signal among a peak value of the digital baseband Tx signal, a pre-defined reference value, and a plurality of pre-defined values.

5. The apparatus of claim 3, wherein the envelope modulator performs a DC/DC amplification operation when output power of the transmitting end is less than the threshold.

6. The apparatus of claim 1, further comprising:
   a delay unit for delaying delivery of the Tx signal during a time for processing an envelope by the envelope gain controller, the detector, and the first DAC;
   a second DAC for converting a digital signal provided from the delay unit into an analog signal; and
   a gain-frequency controller for controlling a gain of the analog signal and for up-converting a baseband signal into an RF signal.

7. The apparatus of claim 6, wherein the gain-frequency controller comprises at least one amplifier and at least one mixer.

8. The apparatus of claim 6, wherein the power amplifier is a class AB amplifier that amplifies power of a signal provided from the gain-frequency controller and that operates by using voltage provided from the envelope modulator as the drain bias.

9. The apparatus of claim 6, further comprising:
   a Tx power controller for determining Tx power of the transmitting end and for controlling operations of the envelope gain controller and the gain-frequency controller to control a signal gain according to the determined Tx power.

10. A method of operating a transmitting end for amplifying a Transmit (Tx) signal according to an Envelope Tracking (ET) scheme in a wireless communication system, the method comprising:
    controlling a gain of a digital baseband Tx signal in accordance with power control;
    wherein, if output power of the transmitting end is greater or equal to a threshold:
      detecting an envelope signal from the digital baseband Tx signal whose gain is controlled, and shaping on the envelope signal,
      converting the shaped envelope signal into an analog envelope signal, and
      generating a drain bias of a power amplifier that amplifies a Radio Frequency (RF) Tx signal by using the analog envelope signal; and
    wherein, if output power of the transmitting end is less than the threshold, generating the drain bias of the power amplifier using a Direct Current (DC) signal, with a magnitude of the DC signal being determined based on the output power.

11. The method of claim 10, wherein the shaping is performed by using a Look-Up Table (LUT) corresponding to a characteristic of the Tx signal among a plurality of LUTs.

12. The method of claim 10, wherein generating the drain bias using the DC signal comprises:
    generating a pulse signal having a duration corresponding to a reference magnitude value; and
    generating the DC signal having the magnitude corresponding to the duration of the pulse signal.

13. The method of claim 12, wherein the reference magnitude value is a value closest to a peak value of the digital baseband Tx signal among a peak value of the digital baseband Tx signal, a pre-defined reference value, and a plurality of pre-defined values.

14. The method of claim 12, wherein generating the drain bias of the power amplifier comprises performing a DC/DC amplification operation when output power of the transmitting end is less than the threshold.

15. The method of claim 10, further comprising:
    delaying delivery of the Tx signal during a time for detecting and shaping the envelope signal;
    converting the delayed Tx signal into an analog Tx signal;
    controlling a gain of the analog Tx signal; and
    up-converting a baseband signal into an RF signal.

16. The method of claim 15, wherein the power amplifier is a class AB amplifier that amplifies power of the RF signal generated from the TX signal and that operates by using an analog signal generated from the envelope signal as the drain bias.

* * * * *